United States Patent [19]

Harada et al.

[11] Patent Number: 5,180,708
[45] Date of Patent: Jan. 19, 1993

[54] PROCESS AND APPARATUS FOR PREPARING SUPERCONDUCTING THIN FILMS

[75] Inventors: Keizo Harada; Hisao Hattori; Hideo Itozaki, all of Itami, Japan

[73] Assignee: Sumitomo Electric Industries, Ltd., Osaka, Japan

[21] Appl. No.: 717,944

[22] Filed: Jun. 20, 1991

[30] Foreign Application Priority Data

Jun. 20, 1990 [JP] Japan ................................. 2-161993
Jun. 20, 1990 [JP] Japan ................................. 2-161994

[51] Int. Cl.$^5$ ...................... H01L 39/24; C23C 14/35
[52] U.S. Cl. .................................. 505/1; 204/192.24;
204/298.23; 204/298.29; 505/731; 505/816
[58] Field of Search .................. 204/192.24, 298.19,
204/298.23, 298.29; 505/1, 731, 816

[56] References Cited

U.S. PATENT DOCUMENTS 5,126,318  6/1992  Gavaler et al. ........................ 505/1

FOREIGN PATENT DOCUMENTS 0343649  11/1989  European Pat. Off. ....... 204/192.24
63-313427  12/1988  Japan ............................. 204/192.24
2-122067   5/1990   Japan ............................. 204/192.24
WO89/11736 11/1989  PCT Int'l Appl. ............. 204/192.24

OTHER PUBLICATIONS

K. Matsutani et al. "Compositional Change of Sputtered $YBa_2Cu_3O_y$ films with Substrate Location" Japanese Journal of Applied Physics, vol. 29, No. 1, Jan. 1990, pp. 79-80.

Y. Kageyama et al. "Effect of a declination angle of substrate position on magnetron sputter deposition from $YBa_2Cu_3O_{7-x}$ target" Applied Physics Letters, vol. 55, No. 4, Sep. 4, 1989, pp. 1035-1037.

Patent Abstracts of Japan, vol. 14, No. 334 (c-074), Jul. 18, 1990.

*Primary Examiner*—Aaron Weisstuch
*Attorney, Agent, or Firm*—Pennie & Edmonds

[57] ABSTRACT

A process for preparing a thin film of high-temperature compound oxide superconductor having a large area on a substrate by a magnetron sputtering method. A magnetron electrode on which an elongated target is secuerd has an elongated shape and a substrate which also has an elongated shape are arranged in such a manner that a surface of the substrate makes a predetermined angle which is not zero with respect to the surface of said elongated target. The substrate is moved slowly along a direction which is transverse to the elongated dimension of the target.

12 Claims, 4 Drawing Sheets

PROCESS AND APPARATUS FOR PREPARING SUPERCONDUCTING THIN FILMS

BACKGROUND OF THE INVENTION

1. Field of the Invention

The present invention relates to a process for preparing superconducting thin films and an apparatus for carrying our the process. More particularly, the present invention relates to a process for preparing a thin film of high temperature compound oxide superconductor on a very large area of a substrate by a magnetron sputtering method and an apparatus for carrying out the process.

2. Description of the Related Art

Bednorz and Müller discovered $(La,Sr)_2CuO_4$, which exhibits superconductivity at 30K, in 1986 (*Z. Phys. B*64, 1986, page 189) C. W. Chu et al. discovered, in the United States of America, another superconducting material, $YBa_2Cu_3O_{7-\delta}$, having a critical temperature of about 90K, in 1987 (*Physical Review Letters*, Vol. 58, No. 9, page 908). Maeda et al. discovered so-called bismuth type superconducting material (*Japanese Journal of Applied Physics*, Vol. 27, No. 2, 1987, pages 1209-1210). In this specification, the term "high-temperature compound oxide superconductor" means compound oxides having a critical temperature above 30K.

The temperature compound oxide superconductors were obtained in the form of a sintered mass prepared by powder metallurgy. However, the sintered mass showed relatively poor superconducting properties, particularly low critical density (Jc). In order to increase the critical current density (Jc), a variety of thin film forming processes of these materials have been studied. Superconducting thin films of these compound oxides can be prepared by a variety of vapor deposition techniques such as vacuum-evaporation, sputtering, and molecular beam epitaxy (MBE) on single crystal substrates such as $SrTiO_3$, MgO or the like. Remarkable improvements in the critical current density of these compound oxides have been achieved in their thin films.

Recently, many studies concerning actual application of the thin films to electronics devices and circuits have been reported and there is strong, steady demand to provide thin films of high-temperature oxide superconductors whose quality is guaranteed and which can be used in the research and development of such devices. In addition, there is a strong demand to provide a thin film of high-temperature oxide superconductor having desired dimensions, particularly having a large area.

Applicants have proposed a sputtering method for preparing thin film of superconducting oxide in which a substrate and a target do not face each other so that the thin film is not damaged by secondary electrons or charged particles of high energy emitted from the target while the thin film is deposited on the substrate.

However, it is difficult to prepare a thin film of high-temperature oxide superconductor on a large area substrate by the conventional film forming techniques such as sputtering or by the applicants' method mentioned above, so that the obtained thin films do not show uniform or homogeneous quality all over the large area. For this reason, it is not easy to fabricate electronics devices and/or circuits on a single thin film.

Therefore, an object of the present invention is to solve the above problems and to provide an effective process for preparing a large thin film of high-temperature compound oxide superconductor of uniform and homogeneous quality on a large area substrate by a magnetron sputtering method and an apparatus for carrying out the process.

SUMMARY OF THE INVENTION

The present invention provides a process for preparing a thin film of a high-temperature compound oxide superconductor on a large area of a substrate by a magnetron sputtering method, characterized in that the magnetron electrode has an elongated shape, an elongated target being secured to the magnetron electrode, in that the substrate also has an elongated shape and is arranged in such a manner that a surface of the substrate makes a predetermined angle which is not zero with respect to the surface of the elongated target, and in that the substrate is moved slowly along a direction which is transverse to an elongated dimension of the target.

The present invention also provides a magnetron sputtering apparatus for preparing a thin film of a high temperature compound oxide superconductor on a large area substrate, comprising an elongated magnetron electrode on which an elongated target is secured, an elongated substrate holder on which an elongated substrate is secured, the elongated substrate holder being arranged in such a manner that the surface of the elongated substrate makes a predetermined angle which is not zero with respect to the surface of the elongated target, and a means for moving the elongated substrate slowly along a direction which is transverse to an elongated dimension for the elongated magnetron electrode during sputtering operation.

According to the present invention, the substrate and the target do not face to each other so that the thin film is not damaged or adversely influenced by secondary electrons or charged particles of high-energy emitted from the target while the thin film is deposited on the substrate. In fact, the substrate is arranged in such a manner that the surface of the substrate makes a predetermined angle which is not zero with respect to the surface of the target. In a preferred embodiment according to the present invention, the surface of the substrate makes an angle of about 90° with respect to the surface of the target. This angle can be 30° to 100° preferably 45° to 90° and more preferably 70° to 90°.

In this tilted arrangement, however, the distance between the surface of the substrate and the surface of the target cannot be kept constant, so that there is a tendency that the quality of the obtained film becomes inhomogeneous. According to the present invention, in order to avoid this defect, an elongated substrate is used. In fact, deviation or change of quality of the thin film can be minimized by reducing the width (the transverse dimension with respect to the elongated dimension) of the substrate, resulting in that a thin film having substantially uniform quality over the entire surface of the substrate can be obtained.

The elongated substrate and the elongated target according to the present invention can have any configuration but usually have a rectangular shape, in particular an oblong shape.

According to the preferred embodiment of the present invention, the elongated substrate is moved slowly along a direction which is transverse to the elongated dimension of the elongated magnetron electrode during sputtering operation in order to compensate for the deviation of distribution of sputtered particles on the elongated substrate. When this preferred embodiment of the present invention is used, there is no special limit of the width dimension of the substrate. In other words, a very large thin film of superconducting oxide thin film can be prepared on a very large substrate. Although the elongated substrate is moved relative to the fixed elongated target in the preferred embodiment, it is possible to move the elongated target relative to the elongated substrate, which is fixed.

The substrate may be moved in one direction, i.e. upwards or downwards or may be reciprocated in both directions. The moving speed of the substrate depends on the operational conditions and can be selected in a range between several millimeters per second and several tens of millimeters per second.

The process according to the present invention is applicable to any known high-temperature compound oxide superconductor, including $(La,Sr)_2CuO_4$, the Y—Ba—Cu—O system such as $Y_1Ba_2Cu_3O_{7-x}$ ($\delta$ is $\pm 1$), the Bi—Sr—Ca—CU—O system, such as $Bi_2Sr_2Ca_2Cu_3O_x$ (x=about 10), and the Tl—Ba—Ca—Cu—O system, such as $Tl_2Ba_2Ca_2Cu_3O_x$ (x=about 10).

The material of the substrate is not limited but is preferably a single crystal oxide such as MgO, $SrTiO_3$, $LaAlO_3$, $LaGaO_3$, and yttrium stabilized zirconia (YSZ).

The magnetron sputtering method used in the present invention is itself well-known. In the present invention, the following operational conditions are preferably used:

Gas pressure during sputtering: 0.1 to 1 Torr
Substrate temperature: 550° to 750° C.
Power supplied during sputtering: 3 to 8 W/cm$^3$ Outside these operational conditions, superconducting properties often drop sharply or may not be exhibited.

The following advantages are obtained by the present invention:

1. A large area thin film of high-temperature compound oxide superconductor can be obtained because sputtered particles whose distribution is enlarged can be deposited on an enlarged area of a substrate.
2. A uniform and homogeneous thin film of high-temperature compound oxide superconductor can be obtained because the surface of the substrate is not faced directly to the surface of the target but is off-set or tilted with respect to the latter.
3. The area of thin film of high-temperature compound oxide superconductor is not limited because the substrate is moved relative to the target.

DESCRIPTION OF THE PREFERRED EMBODIMENTS

Now, the present invention will be described with reference to the accompanying drawings.

Figure 1:
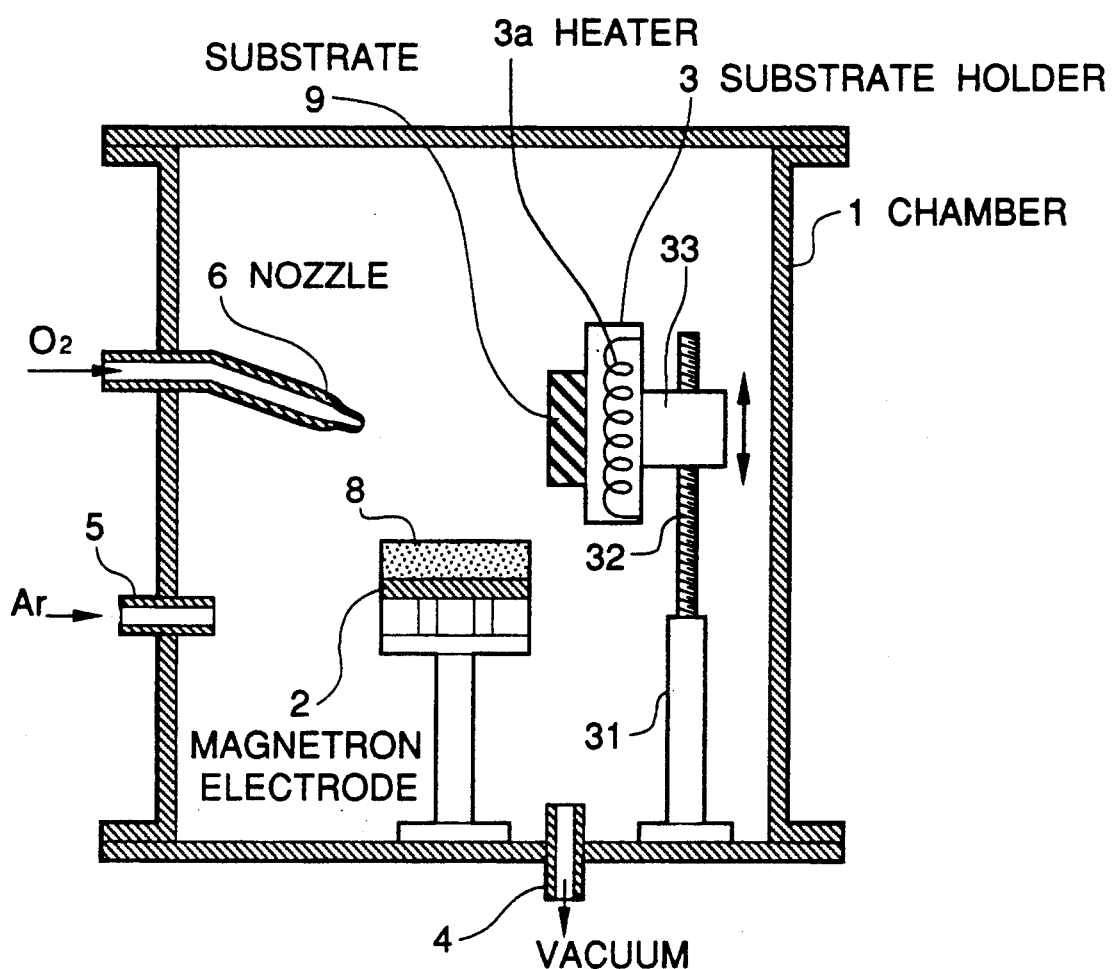
FIG. 1 is an illustrative view of an apparatus which can be used for carrying out the present invention.

FIG. 1 is an illustrative view of an apparatus which can be used for carrying out the process according to the present invention. The apparatus has a vacuum chamber 1. In the vacuum chamber 1, a magnetron electrode 2 which functions also as a target holder, and a substrate holder 3 are arranged. A heater 3a is arranged inside the substrate holder 3. The vacuum chamber 1 is provided with an evacuation port 4 for creating vacuum in the chamber 1, a gas inlet port for introducing sputtering gas and an oxygen feed nozzle 6 for supplying oxygen gas in the vicinity of the surface of a substrate 9 supported on the substrate holder 3.

A nut 33 is secured on a rear side of the substrate holder 3 and is traversed by a screw rod 32 to form a nut-screw rod assembly. The screw rod 32 is supported rotatably in a stand 31 in which a driving mechanism (not shown) for rotating the screw rod 32 is arranged. When the screw rod 32 is rotated by the driving mechanism, the nut 33 and hence the substrate holder 3 together with the substrate 9 is moved up and down.

Figure 2:
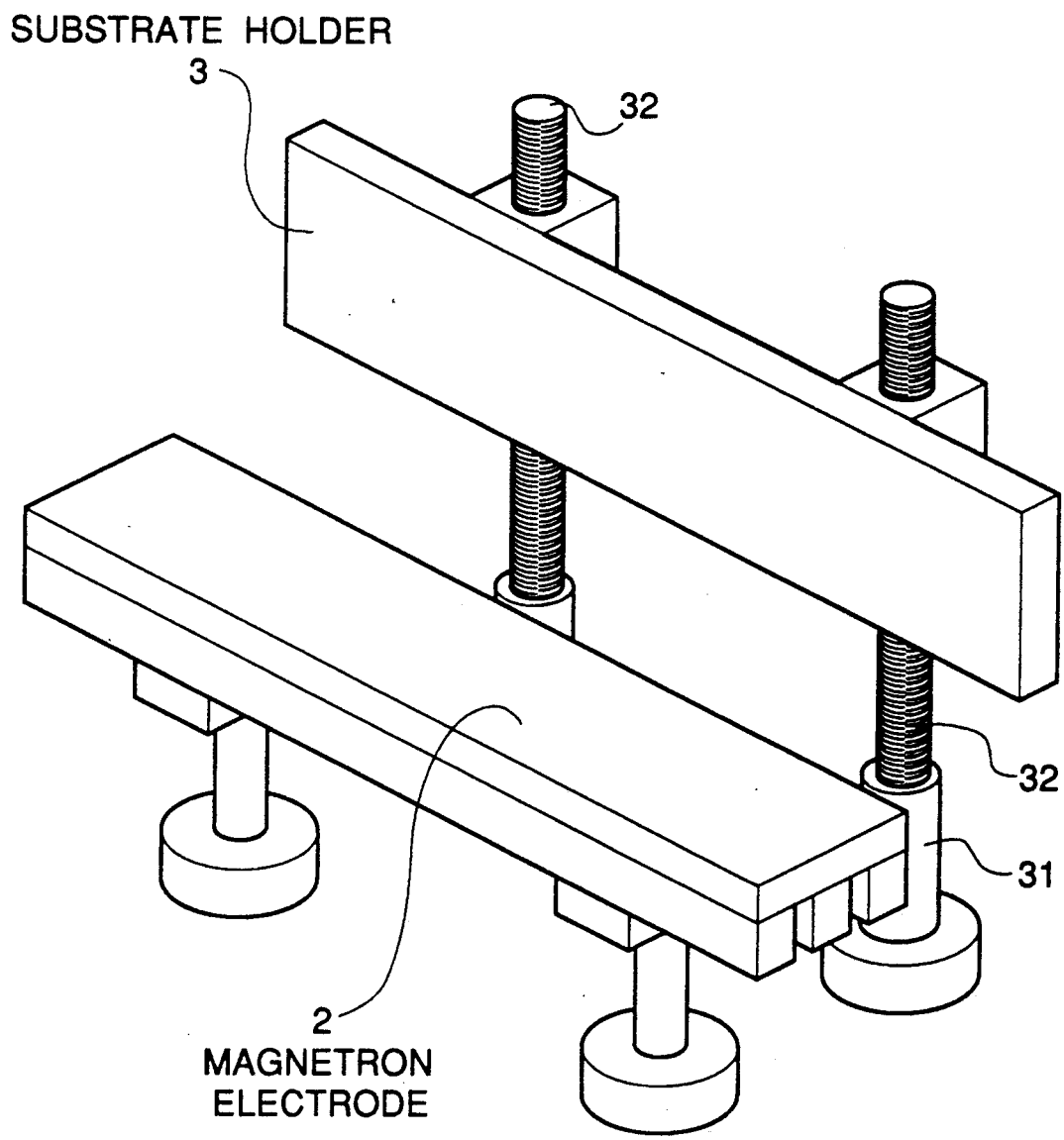
FIG. 2 is a perspective view of a target holder and a substrate holder used in that apparatus shown in FIG. 1.

FIG. 2 is a perspective view which shows relative positions of the target holder/magnetron electrode 2 and the substrate holder 3. In FIG. 1, the target holder/magnetron electrode 2 and the substrate holder 3 extend perpendicularly with respect to the plane of the paper of FIG. 1.

In the embodiment shown in FIG. 2, the target holder/magnetron electrode 2 has an elongated shape. The target 8 which is adapted to be secured on the target holder/magnetron electrode 2 has a surface area which is nearly equal to that of the target holder/magnetron electrode 2. The target holder/magnetron electrode 2 may have a dimension of 200 mm×70 mm.

The substrate holder 3 also has an elongated shape and has a substrate 9 having nearly equal surface area as that of the substrate holder 3. The dimensions of the substrate holder (and the substrate) depend on the dimensions of the target holder/magnetron electrode 2.

In operation, the target 8 is secured on the target holder/magnetron electrode 2 and the substrate 9 is secured on the substrate holder 3. Then, the vacuum chamber 1 is evacuated and inert gas such as argon gas is introduced. The heater 3a is energized to elevate the temperature of the substrate 9 and oxygen gas is supplied continuously through the oxygen feed nozzle 6 onto the substrate 3 to start sputtering operation. During the sputtering, particles sputtered from the target 8 arrive at the substrate 9 and deposit thereon in an oxygen containing atmosphere.

Now, the present invention will be described with reference to examples, but the scope of the present invention should not be limited thereto.

EXAMPLE 1

A superconducting thin film having a composition of $Y_1Ba_2Cu_3O_{7-\delta}$ ($\delta$ is $\pm 1$) was deposited on a (100) plane of a MgO single crystal by a magnetron sputtering method using the apparatus shown in FIG. 1.

The target 8 secured on the magnetron electrode 2 had a dimension of 190×60 mm. The substrate 9 secured on the substrate holder 3 had a dimension of 180×20 mm. The main operational conditions used in the magnetron sputtering are summarized in Table 1:

TABLE 1

| | |
|---|---|
| Target Composition (atomic ratio): | Y:Ba:Cu = 1:2:2.8 |
| Sputtering Gas: | Ar + $O_2$ |
| $O_2/(Ar + O_2)$: | 20% (volume ratio) |
| Gas Pressure: | 0.5 (Torr) |
| Substrate Temperature: | 650 (°C.) |
| Electric Power Applied: | 600 (W), 4.2 (w/cm$^2$) |

TABLE 1-continued

| Film Thickness: | 3000 (Å) |

Figure 3A:
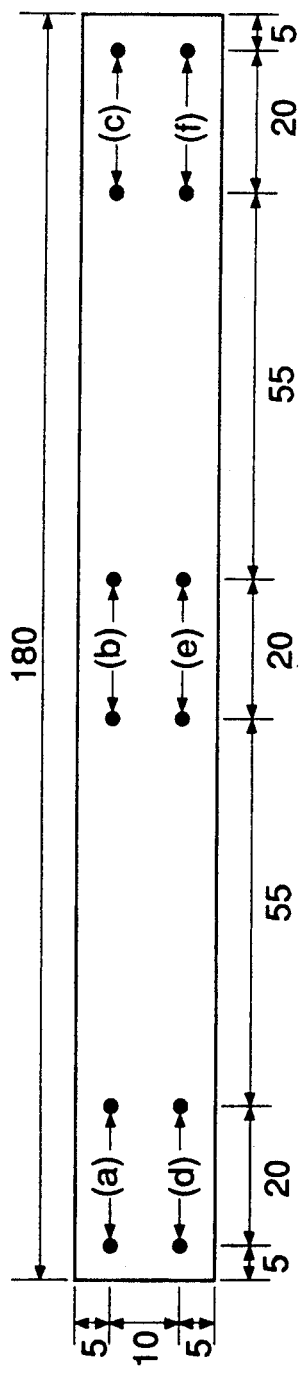
FIGS. 3A and 3B are planar views of thin films prepared in Examples of the present invention and shows locations where superconducting properties were determined.

Superconducting properties (Tc and Jc) were determined at different positions on the obtained thin film. The results are summarized in Table 2. Measurement positions (a to f) are indicated in FIG. 3A.

TABLE 2

| Measurement Position | Critical Temperature Tc (°K.) | Critical Current Density Jc (A/cm$^2$) |
| --- | --- | --- |
| a | 88 | $2.3 \times 10^6$ |
| b | 89 | $3.5 \times 10^6$ |
| c | 87 | $1.9 \times 10^6$ |
| d | 90 | $4.0 \times 10^6$ |
| e | 89 | $3.4 \times 10^6$ |
| f | 86 | $1.8 \times 10^6$ |

[NOTE]:
Critical Temperature (Tc) indicates the temperature at which the electric resistance of the sample falls below the measurement limit
Critical Current Density (Jc) indicates the current density at 77K.

The results reveal that an elongated thin film of compound oxide which is uniform in quality can be prepared on an elongated substrate.

EXAMPLE 2

Example 1 was repeated but the substrate 9 changed to a MgO single crystal (100 plane) having a dimension of 180 mm×60 mm and the substrate holder 3 was reciprocally moved up and down at a velocity of 10 mm/sec.

Figure 3B:
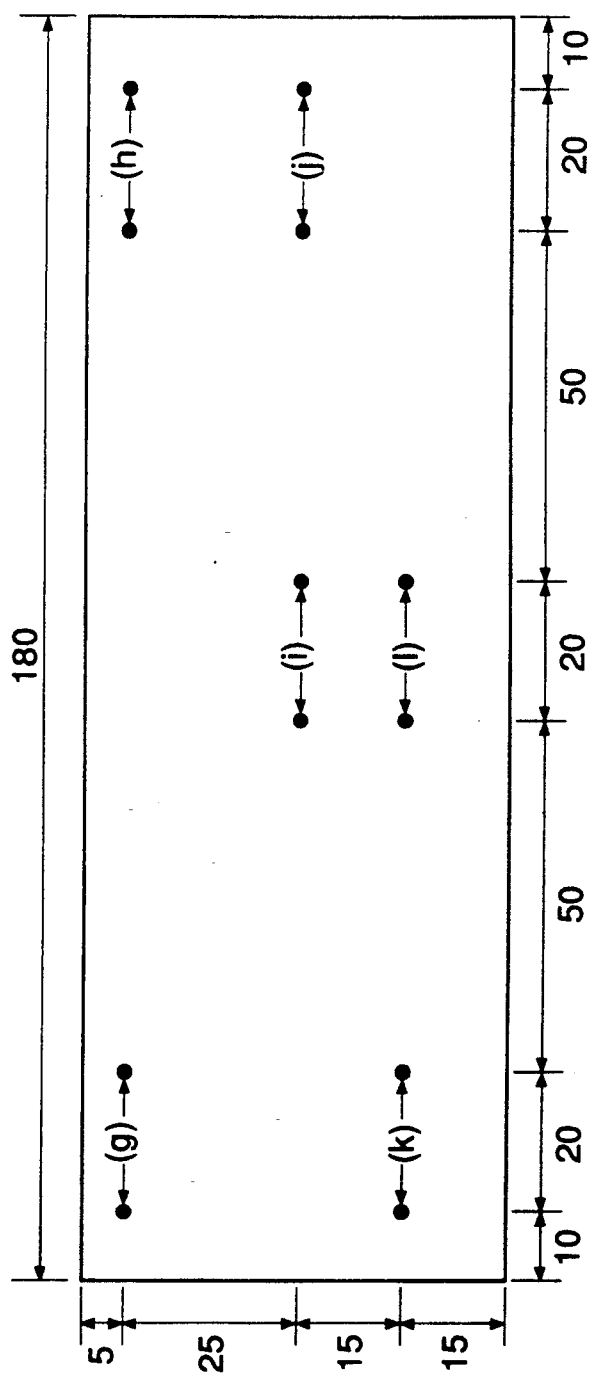

Superconducting properties (Tc and Jc) were determined at different positions on the obtained thin film. The results are summarized in Table 3. Measurement positions (g to 1) are indicated in FIG. 3B.

TABLE 3

| Measurement Position | Critical Temperature Tc (°K.) | Critical Current Density Jc (A/cm$^2$) |
| --- | --- | --- |
| g | 86 | $1.9 \times 10^6$ |
| h | 88 | $2.8 \times 10^6$ |
| i | 89 | $3.1 \times 10^6$ |
| j | 85 | $1.6 \times 10^6$ |
| k | 88 | $2.7 \times 10^6$ |
| l | 87 | $2.2 \times 10^6$ |

The results reveal that uniformity of the superconducting compound oxide thin film was improved along the width direction by reciprocally moving the substrate 9 up and down.

EXAMPLE 3

The same procedure as Example 1 was repeated to prepare a thing film having a composition of Y$_1$Ba$_2$Cu$_3$O$_{7-\delta}$ ($\delta$ is ±1) but, in this example 3, the substrate 9 was changed to a MgO single crystal (100 plane) having a dimension of 180 mm×60 mm and the substrate holder 3 was reciprocally moved up and down at a velocity of 10 mm/sec and the substrate temperature was changed in a range of 500° and 700° C. in intervals of 50° C. to prepare several samples. The main operational conditions used are summarized in Table 4:

TABLE 4

| Target Composition (atomic ratio): | Y:Ba:Cu = 1:2:2.8 |
| Sputtering Gas: | Ar + O$_2$ |
| O$_2$/(Ar + O$_2$): | 20% (volume ratio) |
| Gas Pressure: | 0.5 (Torr) |
| Electric Power Applied: | 600 (W), 4.2 (W/cm$^2$) |
| Film Thickness: | 3000 (Å) |

TABLE 4-continued

| Substrate Displacement Velocity: | 10 (mm/sec) |

Figure 4:
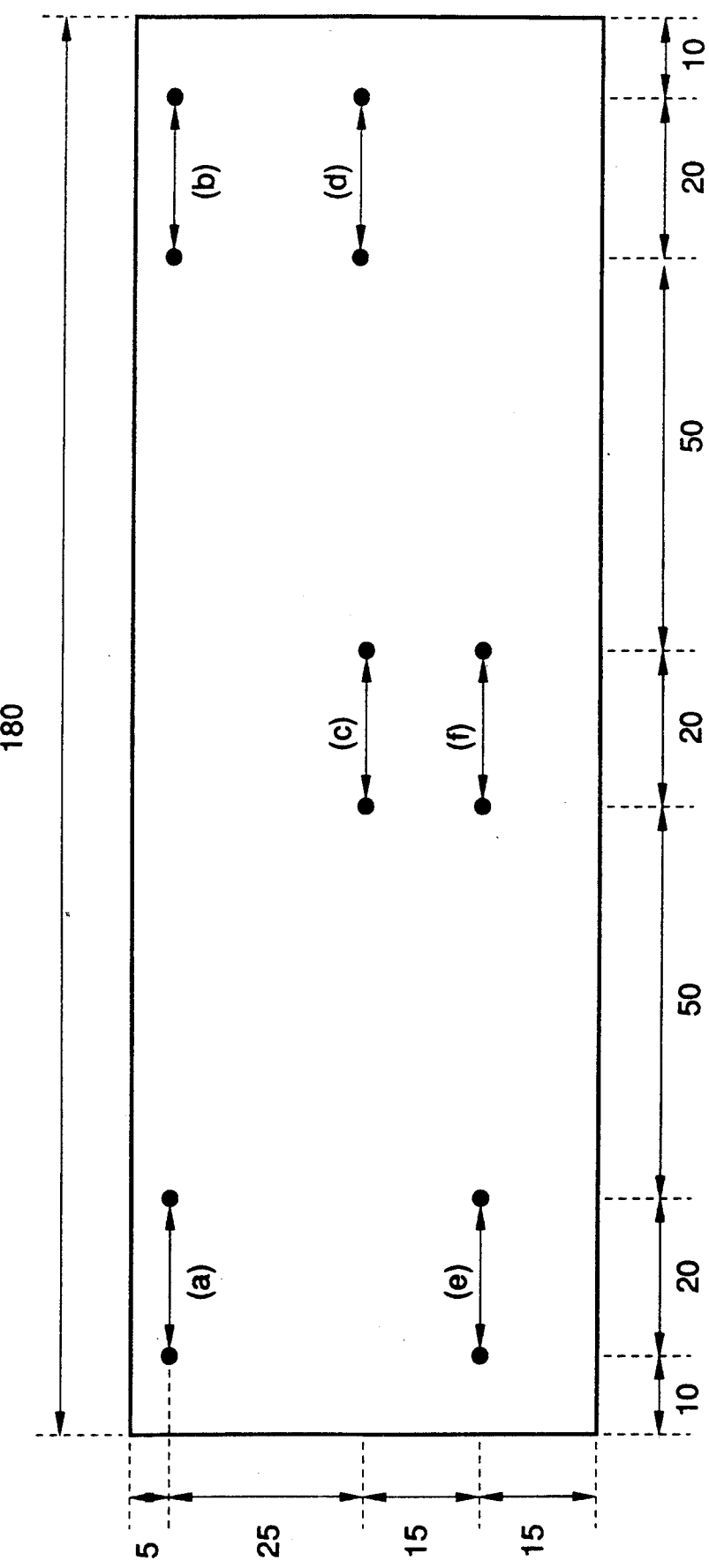
FIG. 4 is another planar view which is similar to FIG. 3 and which shows locations where superconducting properties were determined in another Example of the present invention.

Superconducting properties (Tc and Jc) were determined at different positions on the obtained thin film. The results are summarized in Table 5. Measurement positions (a to f) are indicated in FIG. 4.

TABLE 5

| Measurement Position | Tc/Jc | Substrate Temperature (°C.) | | | | |
| --- | --- | --- | --- | --- | --- | --- |
| | | 550 | 600 | 650 | 700 | 750 |
| a | Tc | 72 | 83 | 86 | 84 | 68 |
| | Jc | — | $9.2 \times 10^5$ | $1.9 \times 10^6$ | $7.1 \times 10^6$ | — |
| b | Tc | 69 | 81 | 88 | 82 | 64 |
| | Jc | — | $8.1 \times 10^5$ | $2.8 \times 10^6$ | $9.1 \times 10^5$ | — |
| c | Tc | 70 | 86 | 89 | 83 | 61 |
| | Jc | — | $1.7 \times 10^6$ | $3.1 \times 10^6$ | $9.3 \times 10^5$ | — |
| d | Tc | 67 | 82 | 85 | 83 | 65 |
| | Jc | — | $9.0 \times 10^5$ | $1.6 \times 10^6$ | $8.1 \times 10^5$ | — |
| e | Tc | 74 | 85 | 88 | 81 | 62 |
| | Jc | — | $1.2 \times 10^6$ | $2.7 \times 10^6$ | $8.9 \times 10^5$ | — |
| f | Tc | 71 | 80 | 87 | 80 | 59 |
| | Jc | — | $6.5 \times 10^5$ | $2.2 \times 10^6$ | $6.2 \times 10^6$ | — |

EXAMPLE 4

Example 3 was repeated but the substrate temperature was fixed at 650° C. while the gas pressure was modified as is shown in Table 6. The other operational conditions were the same as in Example 3.

Results obtained are summarized in Table 6. Measurement positions are the same as Example 3 (FIG. 4).

TABLE 6

| Measurement Position | Tc/Jc | Gas Pressure (Torr) | | | | |
| --- | --- | --- | --- | --- | --- | --- |
| | | .050 | 0.2 | 0.5 | 1.0 | 2.0 |
| a | Tc | 52 | 81 | 86 | 84 | 78 |
| | Jc | — | $8.9 \times 10^5$ | $1.9 \times 10^6$ | $7.2 \times 10^6$ | $1.2 \times 10^4$ |
| b | Tc | 48 | 83 | 88 | 87 | 74 |
| | Jc | — | $9.8 \times 10^5$ | $2.8 \times 10^6$ | $2.8 \times 10^6$ | — |
| c | Tc | 39 | 84 | 89 | 86 | 71 |
| | Jc | — | $1.2 \times 10^6$ | $3.1 \times 10^6$ | $2.5 \times 10^6$ | — |
| d | Tc | 49 | 83 | 85 | 82 | 73 |
| | Jc | — | $9.1 \times 10^5$ | $1.6 \times 10^6$ | $1.0 \times 10^6$ | — |
| e | Tc | 50 | 85 | 88 | 84 | 72 |
| | Jc | — | $2.1 \times 10^6$ | $2.7 \times 10^6$ | $1.7 \times 10^6$ | — |
| f | Tc | 32 | 83 | 87 | 85 | 76 |
| | Jc | — | $1.0 \times 10^6$ | $2.2 \times 10^6$ | $2.2 \times 10^6$ | — |

EXAMPLE 5

The same procedure as in Example 3 was repeated but the substrate temperature was fixed at 650° C. while the electric power applied was modified as is shown in Table 7. The other operational conditions were the same as in Example 3.

Results obtained are summarized in Table 7. Measurement positions are the same as Example 3 (FIG. 4).

TABLE 7

| Measurement Position | Tc/Jc | Electric Power Applied (W) | | | | |
| --- | --- | --- | --- | --- | --- | --- |
| | | 300 | 450 | 600 | 800 | 1000 |
| a | Tc | 38 | 81 | 86 | 87 | 81 |
| | Jc | — | $8.1 \times 10^5$ | $1.9 \times 10^6$ | $2.3 \times 10^6$ | $6.8 \times 10^5$ |
| b | Tc | 41 | 83 | 88 | 86 | 77 |
| | Jc | — | $1.2 \times 10^6$ | $2.8 \times 10^6$ | $2.1 \times 10^6$ | — |
| c | Tc | 37 | 85 | 89 | 88 | 80 |

TABLE 7-continued

| Measurement Position | Tc/Jc | 300 | 450 | 600 | 800 | 1000 |
|---|---|---|---|---|---|---|
|   | Jc | — | $1.5 \times 10^6$ | $3.1 \times 10^6$ | $3.3 \times 10^6$ | $6.1 \times 10^5$ |
| d | Tc | 36 | 84 | 85 | 89 | 78 |
|   | Jc | — | $1.3 \times 10^6$ | $1.6 \times 10^6$ | $3.7 \times 10^6$ | $1.8 \times 10^4$ |
| e | Tc | 42 | 86 | 88 | 87 | 79 |
|   | Jc | — | $2.0 \times 10^6$ | $2.7 \times 10^6$ | $2.9 \times 10^6$ | $9.8 \times 10^4$ |
| f | Tc | 50 | 84 | 87 | 88 | 80 |

We claim:

1. A process for preparing a thin film of a high-temperature compound oxide superconductor having a large area on a substrate by a magnetron sputtering method, characterized in that a magnetron electrode on which an elongated target is secured has an elongated shape, in that the said substrate also has an elongated shape and is arranged in such a manner that a surface of said substrate makes a predetermined angle which is not zero with respect to said surface of said elongated target, and in that said substrate is moved along a direction which is transverse to the elongated dimension of said target.

2. The process set forth in claim 1 wherein said surface of said elongated substrate makes an angle of about 90 degrees with respect to said surface of said elongated target.

3. The process set forth in claim 1 wherein said elongated substrate is moved relative to said elongated target at a speed selected in a range between several millimeters per second and several tens of millimeters per second.

4. The process set forth in claim 1 wherein each of said elongated substrate and said elongated target has a rectangular shape.

5. The process set forth in claim 1 wherein said high-temperature compound oxide superconductor is a member selected from the group consisting of $(La,Sr)_2CuO_4$, the Y—Ba—Cu—O system, the Bi—Sr—Ca—Cu—O system, and the Tl—Ba—Ca—Cu—O system.

6. The process set forth in claim 1 wherein the substrate is a single crystal of an oxide selected from the group consisting of MgO, $SrTiO_3$, $LaAlO_3$, $LaGaO_3$, and yttrium stabilized zirconia (YSZ).

7. The process set forth in claim 1 wherein the gas pressure during sputtering is within a range of 0.1 Torr and 1 Torr.

8. The process set forth in claim 1 wherein the substrate temperature during sputtering is selected in a range of 550° to 750° C.

9. The process set forth in claim 1 wherein the power supplied during sputtering is selected in a range of 3 to 8 W/cm$^3$.

10. A magnetron sputtering apparatus for preparing a thin film of high-temperature compound oxide superconductor having a large surface area on a substrate, comprising an elongated magnetron electrode on which an elongated target is adapted to be secured, an elongated substrate holder on which an elongated substrate is adapted to be secured, said elongated substrate holder being arranged in such a manner that a surface of said elongated substrate makes a predetermined angle which is not zero with respect to said surface of said elongated target, and a means for moving said elongated substrate along a direction which is transverse to the dimension of said elongated magnetron electrode during sputtering operation.

11. The apparatus set forth in claim 10 wherein an oxygen feed nozzle is provided in the vicinity of said surface of said substrate holder.

12. The apparatus set forth in claim 10 wherein said means for moving said elongated substrate comprises a nut secured on the rear side of said substrate holder, a screw rod passing through said nut, and a driving mechanism for rotating said screw rod.

* * * * *